United States Patent [19]

Bronner et al.

[11] Patent Number: 5,525,531
[45] Date of Patent: Jun. 11, 1996

[54] SOI DRAM WITH FIELD-SHIELD ISOLATION

[75] Inventors: Gary B. Bronner, Stormville, N.Y.;
John K. DeBrosse, Burlington, Vt.;
Jack A. Mandelman, Stormville, N.Y.

[73] Assignee: International Business Machines Corporation, Armonk, N.Y.

[21] Appl. No.: 461,815

[22] Filed: Jun. 5, 1995

[51] Int. Cl.[6] .................................................. H01L 21/8242
[52] U.S. Cl. ........................ 437/52; 437/60; 437/919
[58] Field of Search .................................. 437/47, 52, 60, 437/83, 203, 919; 257/302

[56] References Cited

U.S. PATENT DOCUMENTS

| 5,369,049 | 11/1994 | Acocella et al. | 437/52 |
| 5,384,277 | 1/1995 | Hsu et al. | 437/52 |

Primary Examiner—Tom Thomas

[57] ABSTRACT

An SOI deep-trench DRAM having body contacts and field shield isolation makes contact between the SOI device layer and a buried conductive layer below the insulating layer at selected sites between adjacent deep trench capacitors. The buried layer may be biased to provide better attraction for holes.

16 Claims, 6 Drawing Sheets

SOI DRAM WITH FIELD-SHIELD ISOLATION

TECHNICAL FIELD

The technical field of the invention is that of silicon-on-insulator (SOI) circuits, in particular DRAMs.

BACKGROUND OF THE INVENTION

SOI technology has been researched for many years and has some well known advantages, in particular that of increased operating speed, lower capacitance, and the possibility of using lower voltage.

A well known problem in SOI technology is the need for a contact to the body of the transistor and the problem of making the contact without the consumption of too much space.

SUMMARY OF THE INVENTION

The invention relates to an SOI DRAM incorporating the use of a self-aligned body contact that is interconnected by means of a doped layer below the oxide insulating layer.

DESCRIPTION OF THE PREFERRED EMBODIMENT

Figure 1:
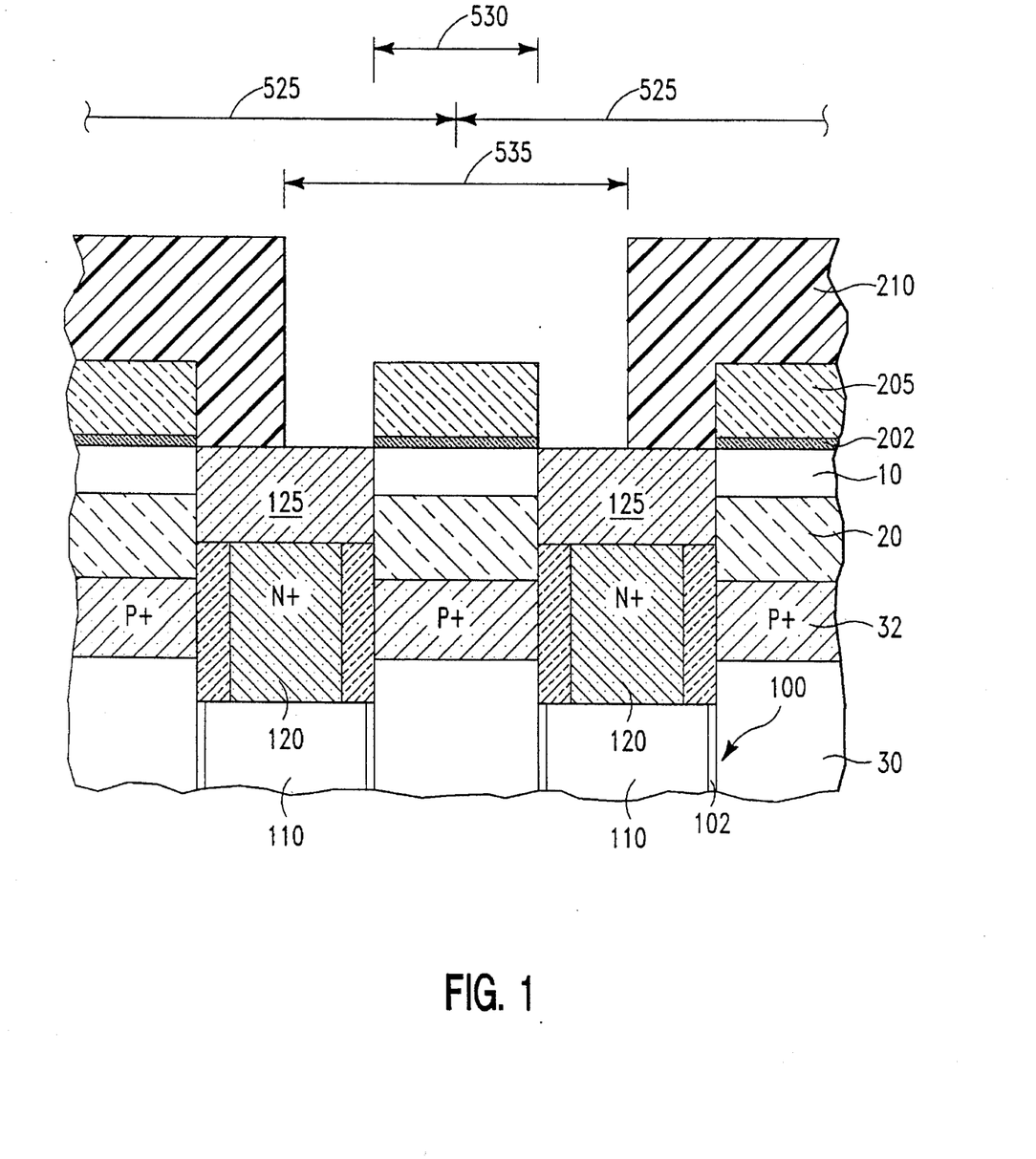
FIGS. 1 through 4 illustrate in cross-section a portion of a DRAM showing adjacent deep trench capacitors and associated body contact and field-shield isolation at various points in the fabrication process.

Referring to FIG. 1, there is illustrated in cross section a portion of a DRAM according to the invention after the performance of some initial steps. Conventional steps such as threshold or field implants are referred to as preparing the substrate. An SOI wafer having an n-type substrate 30, and oxide ($SiO_2$) layer 20 and p-type SOI (or device) silicon layer 10 for the formation of the (N-FET) transistors is used for starting material. The n-type substrate will be used for the storage capacitor plate in an n-channel array. In a complementary embodiment, a p-type substrate can be used with a P-type array (and even with an n-type array having reduced storage capacity).

A $P^+$ layer 32 is formed by implanting boron to form layer 32 below SOI back oxide 20. For an illustrative thickness, appropriate to 0.25 μm ground rule technology, of 100 nm of oxide layer 20 and 80 nm for device layer 10, a boron concentration of $4 \times 10^{17}/cm^3$ is implanted to form a layer 10. Layer 32, having a boron concentration of about $5 \times 10^{19}/cm^3$ and a thickness that may be in the range of 25 to 400 nm, will be used to provide a wiring level for the body contacts. The n-type substrate serves as the common plate of the cell capacitors in the array.

Conventional pad oxide (8 nm) and nitride, $Si_3N_4$, (200 nm) layers are formed using standard processing.

A deep trench (DT) mask is used to pattern the wafer and a conventional ion etching process (sometimes called reactive ion etching, RIE) using HBR and $NF_3$ as the etchant in an Applied Materials 5000 etching tool is used to etch deep trenches 100 for the cell capacitors. Conventionally, the deep trenches may have a depth of between 1 and 8 μm.

A thin node dielectric 102 (illustratively formed by rapid thermal nitridation and re-oxidation in a known process) is formed in the deep trench capacitors as the capacitor dielectric. Other dielectrics may be used if preferred.

The trench is filled with $N^+$ polycrystalline silicon (poly) 110 that is recessed by any convenient method such as RIE to a level below the junction between buried $P^+$ layer 32 and substrate 30. This defines where the bottom of the isolation collar that separates the capacitor from plate 30 and the capacitor from p+layer 32. Poly 110 forms the interior electrode of the capacitors and substrate 30 forms the common electrode for the capacitor array. The isolation collar prevents high-field generation in $p^+$ layer 32 and in n-substrate 30.

The node dielectric 102 above poly filler 110 is removed and collar oxide shown as 114 and 116 is deposited in a conventional CVD process followed by RIE to remove the oxide in the bottom of the upper portion of the trench.

The top of the trench is filled with poly 120 (may be $N^+$ or intrinsic poly depending on amount of buried strap outdiffusion desired) and recessed by any convenient method such as RIE such that top of poly 120 lies within the limits of back oxide 20. Collar oxide 114 is recessed to the same depth as poly 120. A layer of intrinsic poly fill 125 is deposited and recessed to the level of the SOI surface.

Figure 5:
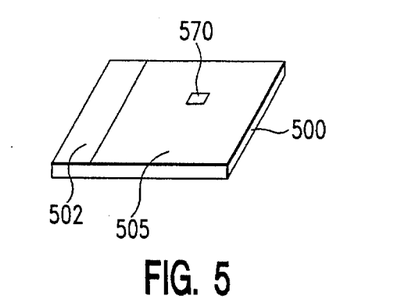
FIG. 5 show a top view of a segment of a memory array.
Figure 5A:
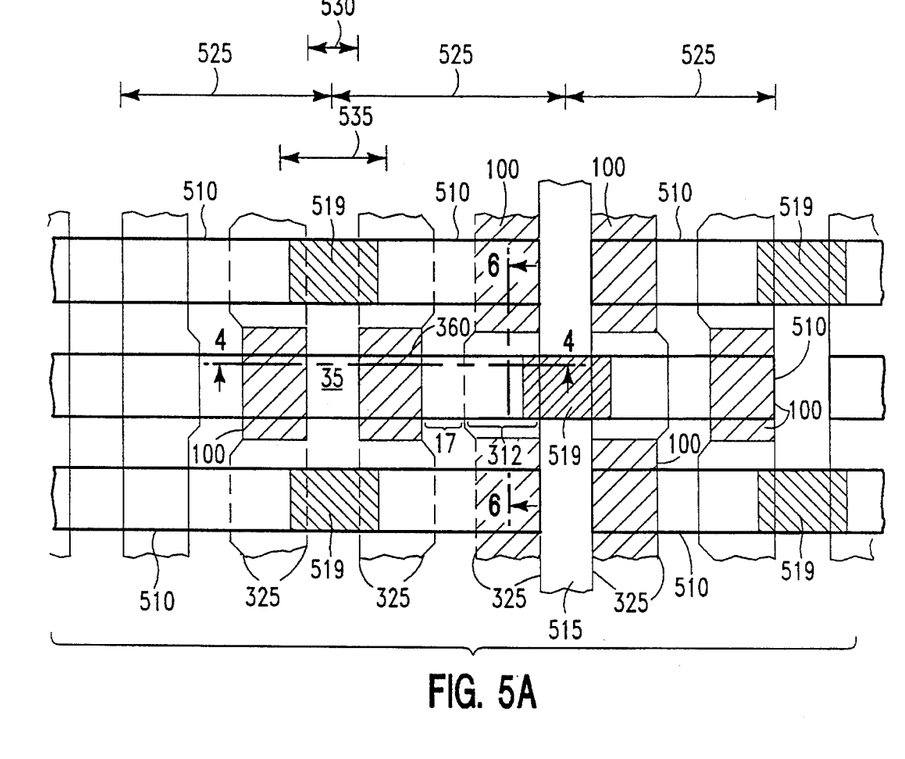

A strap mask (ST mask) is used to define the pattern in PR shown in FIG. 1, exposing half of a pair of neighboring trenches. The area between is protected by the nitride and the strap is defined by the combination of the photoresist and the nitride between the trenches. A top view of the cell layout is shown in FIG. 5, showing a set of arrows labelled with the numeral 525 that denote the length of a DRAM cell, an arrow labelled with the numeral 530 that denotes the length of the region within which the body contact will be formed, and an arrow labelled with the numeral 535 that denotes the aperture shown in FIG. 1. Corresponding arrows are shown in FIG. 1.

With strap mask PR 210 in place, a RIE operation is performed through polysilicon 125 and collar oxide 116 in the deep trench, past the bottom of back oxide 20. The strap mask PR and nitride pad 205 form the mask for this RIE, which defines the strap connection between the center electrode of the capacitor and the transistor.

Figure 2:
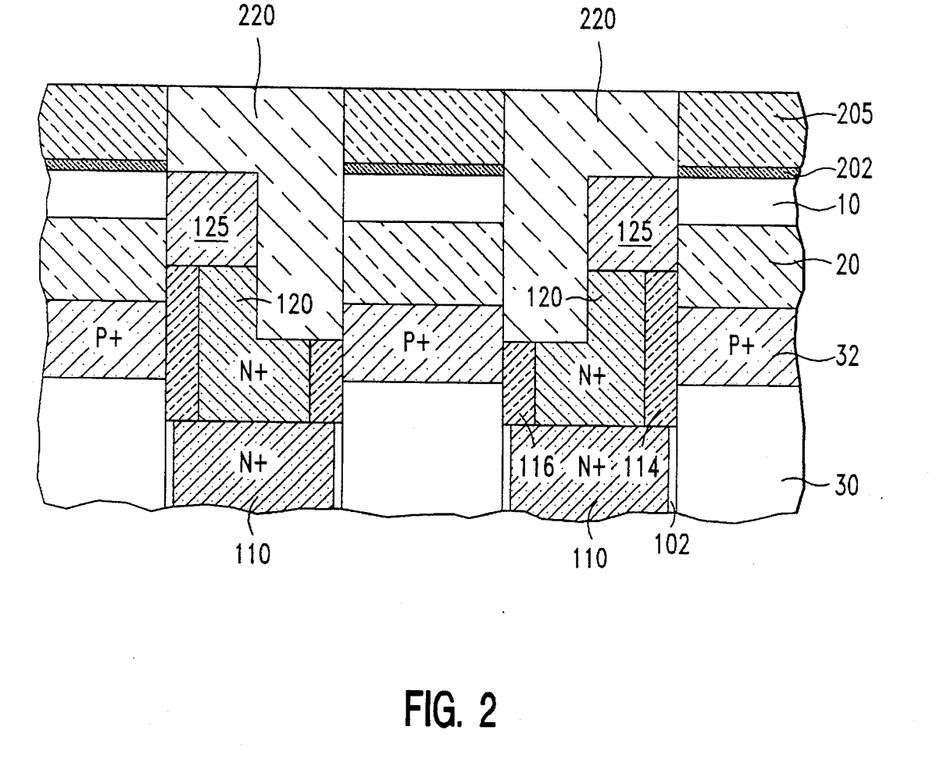

Referring to FIG. 2, the result of stripping Photoresist 210 followed by depositing and planarizing tetraethoxysilane (TEOS), using chemical-mechanical polishing, etchback or any other convenient technique, to the level of the nitride pad 205. A smaller region of poly 125 remains as the strap for the cell, separated from the area in the center of the Figure that will contain the connection between the body contact and the buried conductive layer 32 by TEOS 220. This method of connecting the body contacts to the buried layer allows a folded bitline DRAM cell to be made in eight lithographic squares. Thus, there is no area penalty associated with the use of a body contact according to the invention.

Since the support logic circuits outside the array are CMOS, field-shield isolation would take too much area because of the need to isolate NFETs and PFETs separately. Standard processing is thus used for shallow trench isolation in the supporting circuitry outside the array.

Figure 3:
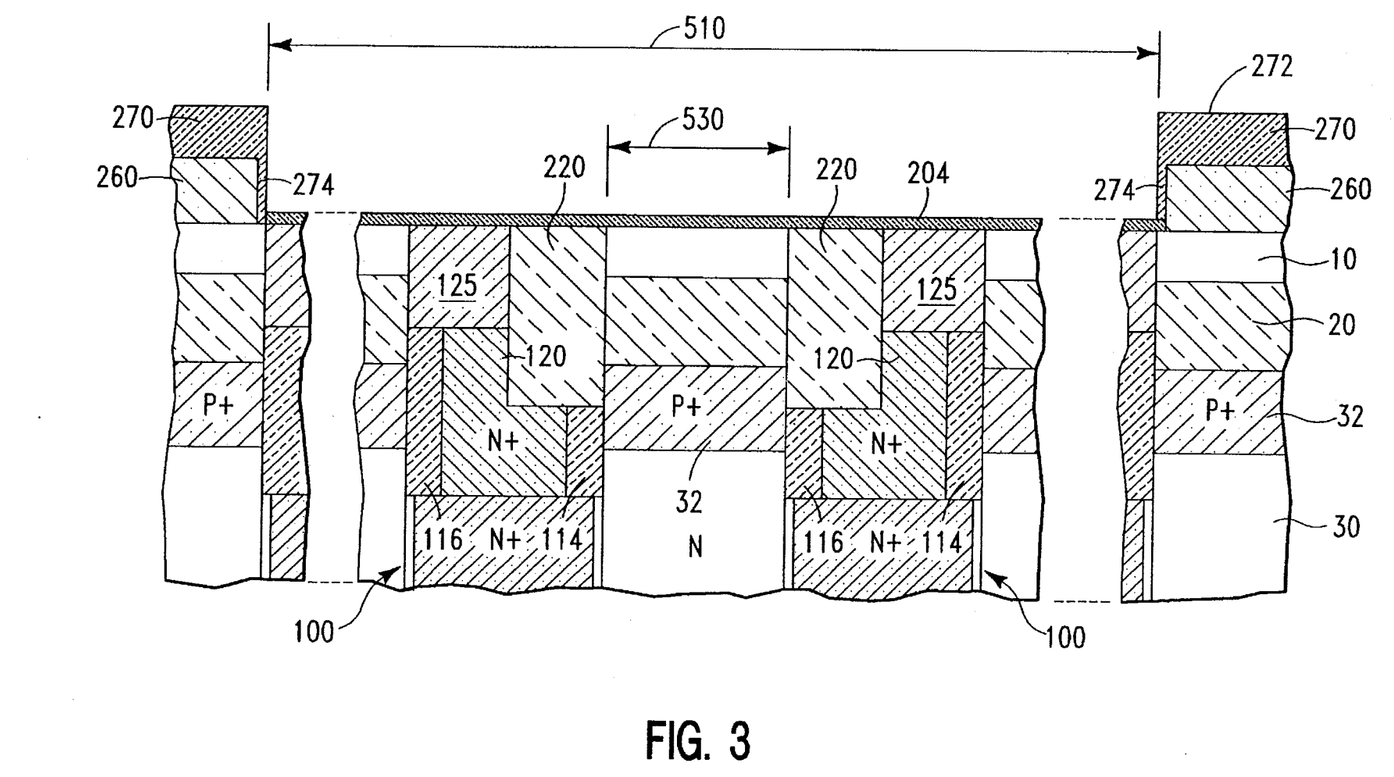

Referring now to FIG. 3, there is shown the same area as FIGS. 1 and 2 after stripping pad layers 202 and 205; growing sacrificial oxide 204 (8 nm); and depositing poly field shield layer 260 (100 nm) and field shield cap 270 (100 nm). Oxide 204 will also serve as the isolation oxide under the field-shield as well as sacrificial oxide in the active areas.

FIG. 3 shows the area after array active areas have been opened in field-shield 260 with the FS mask. The FS mask opens the field-shield where it is desired to later form the active device areas, body contacts and bitline contacts. The edge of the active area aperture 510 shown in FIG. 5 is denoted in FIG. 3 with an arrow labelled 510. The placement of a body contact between every back-to-back pair of deep trenches is unnecessary. Referring again to FIG. 5, the apertures 510 in the top and bottom rows of the figure are separated by a blank space that is covered by the field shield. As can be seen, the body contact member connecting buried wiring layer 32 with device layer 10 is not adjacent to the transistor body. It is positioned, however, so that holes from several transistors may flow away from the bodies of those transistors to it and thus is a contact between buried layer 32 and the transistor bodies. By staggering the body contacts, lower effective sheet resistivity for the field-shield may be realized, since there will be more locations available for field shield continuity.

Those skilled in the art will appreciate that the use of $P^+$ poly provides an additional 1 V built-in bias for shutting off the isolation region, compared to the effect of $N^+$ poly. Additionally, any boron diffusion through the isolation oxide will improve isolation.

A nitride spacer 274 has been formed on the edges of field-shield 260 by a conventional conformal deposition process such as LPCVD nitride deposition. The edge of the field shield and cap is shown off to the side in FIG. 3.

Figure 4:
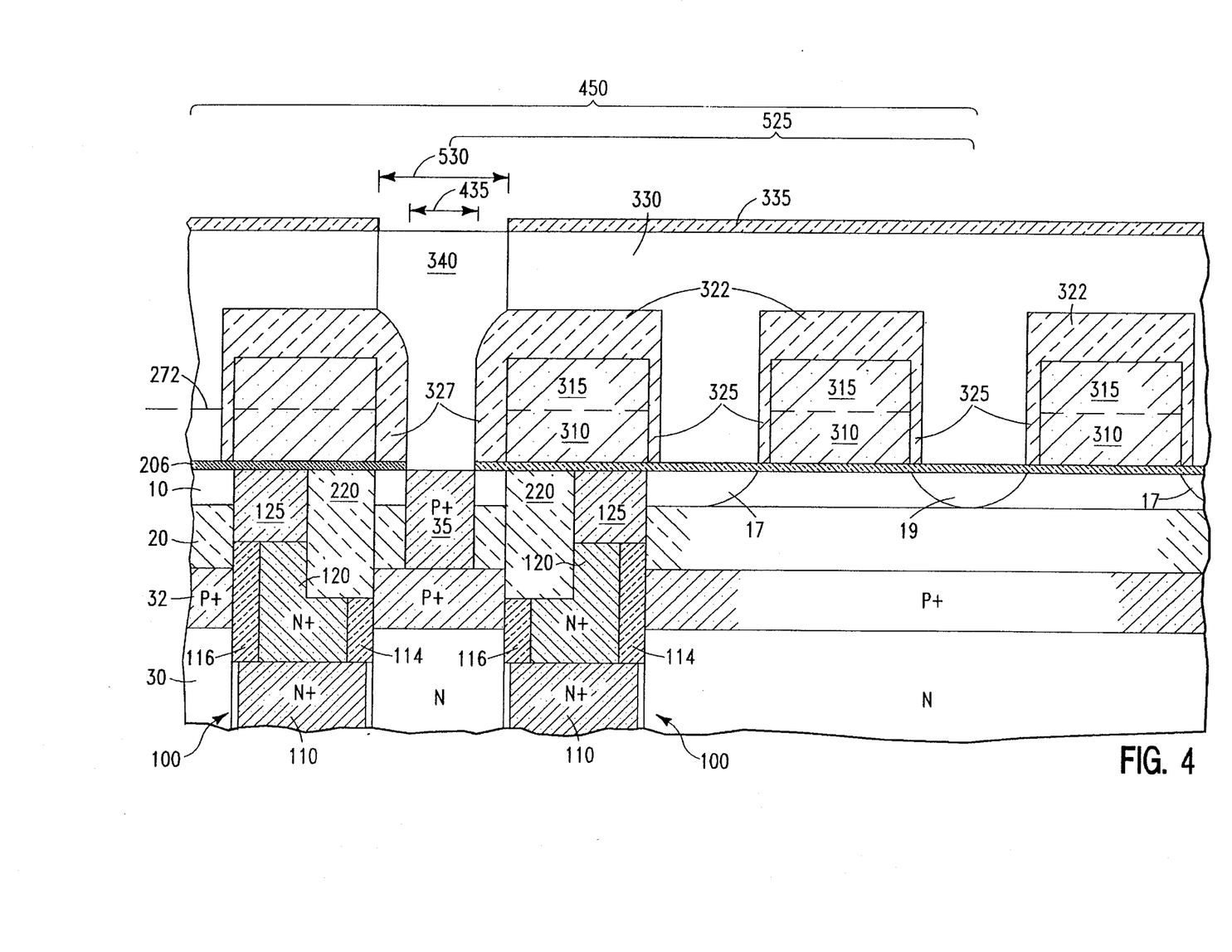

Referring now to FIG. 4, there is shown the area in FIGS. 1–3 plus the complete DRAM cell. The area denoted by the bracket labelled 450 is the cross section indicated by 4—4 in FIG. 5. Bracket 525 corresponds to one DRAM cell extending from midway between the back to back trenches to midway through the bitline contact, indicated by arrows 525 in FIG. 5.

FIG. 4 shows the result of removing the exposed sacrificial oxide 204 in the active areas; growing conventional gate oxide 206, illustratively to a thickness of 8 nm; depositing a first gate conductive poly layer 310 (also referred to as a gate contact layer) to substantially the same thickness as field shield layer 260 plus cap 270 and a nitride cap layer 320; and processing them as described below to provide improved planarity.

The area outside the array containing the support circuitry is masked and nitride cap layer 320 is stripped from GC layer 310 in the array. A chemical-mechanical polish (CMP) operation reduces the thickness of layer 310 to that of the field-shield 260 plus the cap 270, using the field shield cap 270 as a polish stop. The result of this operation is a common surface 272 both inside and outside the array. Outside the array, the layer is uniform, since it has not yet been patterned, and within the array, there is a pattern of poly 310 inset into the active array apertures in field-shield 260. Such a pattern of inset conductors is referred to as damascene.

Next, nitride cap 320 is removed from poly 310 in the circuitry outside the array. A second gate conductive poly layer 315 (or other conductive layer) is deposited above the lower poly and nitride cap 322 is deposited above it. This leaves a poly composite gate conductive layer 310–315 over the areas that will be the gates and a single poly layer 315 over the field shield 260 (and field cap 270). The boundary between layers 310 and 315 is indicated with dotted lines in FIG. 4 and a phantom line denoted with the numeral 272 indicates the level of top surface 272 of the field cap.

Layers 322, 315 and 310 are etched to define the gates, wordlines (and, optionally, local interconnects) both in the array and outside it. The damascene gate contact process solves the depth of focus problem with the level of the gate conductors in the array vs. the supports by making the gate conductor height uniform in the support circuitry and in the array. A conventional implant for the sources and drains 17 and 19 is performed, after which nitride spacers 325 are formed on the edges of the gates. Since the sources and drains are implanted through the field shield aperture 510, the implant is blocked by the field shield outside the aperture. As indicated by bracket 525, a DRAM cell extends from the common diffusion 19 (common to a pair of cells) through the gate and past the edge of trench capacitor 100. Strap 125 is made conductive by diffusion from poly 120 and electrode 17 at any convenient time, illustratively during annealing and oxidation steps.

Next, phospho-silicate glass (PSG) or other dielectric layer 330 is deposited and planarized, after which nitride cap 335 is deposited. Nitride cap 335 is opened using a body-contact mask and PSG 330 and gate oxide 206 are etched to the surface of SOI 100 An additional nitride spacer 327 is now formed on the exposed sidewalls of the aperture for forming the body contact. This assures that the body contact will not short to the capacitor node under worst case alignment and film tolerance conditions.

A self-aligned body contact aperture for the body contact connecting the buried layer and the body in SOI layer 10 is formed by etching through SOI 10 and back oxide 20 down to $P^+$ buried layer 32. The body contact aperture that has been formed is filled with $P^+$ poly 35. $P^+$ poly 35 is recessed to the surface of SOI 10 by any convenient method such as RIE. This forms the body contact between layer 32 and the transistor body in layer 10. The current flow from the transistor body is perpendicular to the plane of the paper in FIG. 4, since the cross section 4—4 in FIG. 5 has been taken through the active area aperture axis that passes through the transistor. Referring to FIG. 5, it can be seen that the holes will flow from the area under the gate, denoted with bracket 312, past electrode 17 and trench capacitor 100, denoted with brackets labelled with those numbers, upward or downward in FIG. 5 to body contact 35.

Next, the aperture above body contact 35 is filled with a suitable insulator 340, such as oxide. Nitride cap 335 is stripped and conventional processing is used to complete the circuit. Conventional steps such as making contact to bit and word lines, forming the interconnections in the array and in the support circuitry will be referred to as completing the circuit. As is known in the art, the gate contacts formed from layer 315 are the wordlines of the array (optionally supplemented by low-resistivity lines positioned above the lines shown in FIG. 4) and the bitlines will extend at right angles to the word lines. A bitline contact, shown as box 519 in FIG. 5, will be formed above diffusion 19 in FIG. 4 and a bitline (515 in FIG. 5) will be formed above the bitline contact. The dotted lines 325 in FIG. 5 denote the nitride spacers 325 in FIG. 4 and serve to indicate the path of the poly gate contact layers. Similarly, dotted boxes 100 indicate deep trenches 100.

Additionally, FIG. 5 shows schematically an overall view of an integrated circuit 500 according to the invention, in which I/O support circuitry is shown as block 502, including conventional I/O buffers, decoders, sense amplifiers and the like. The upper portion of the figure shows in detail a small portion of memory array 505 of circuit 500.

Figure 6:
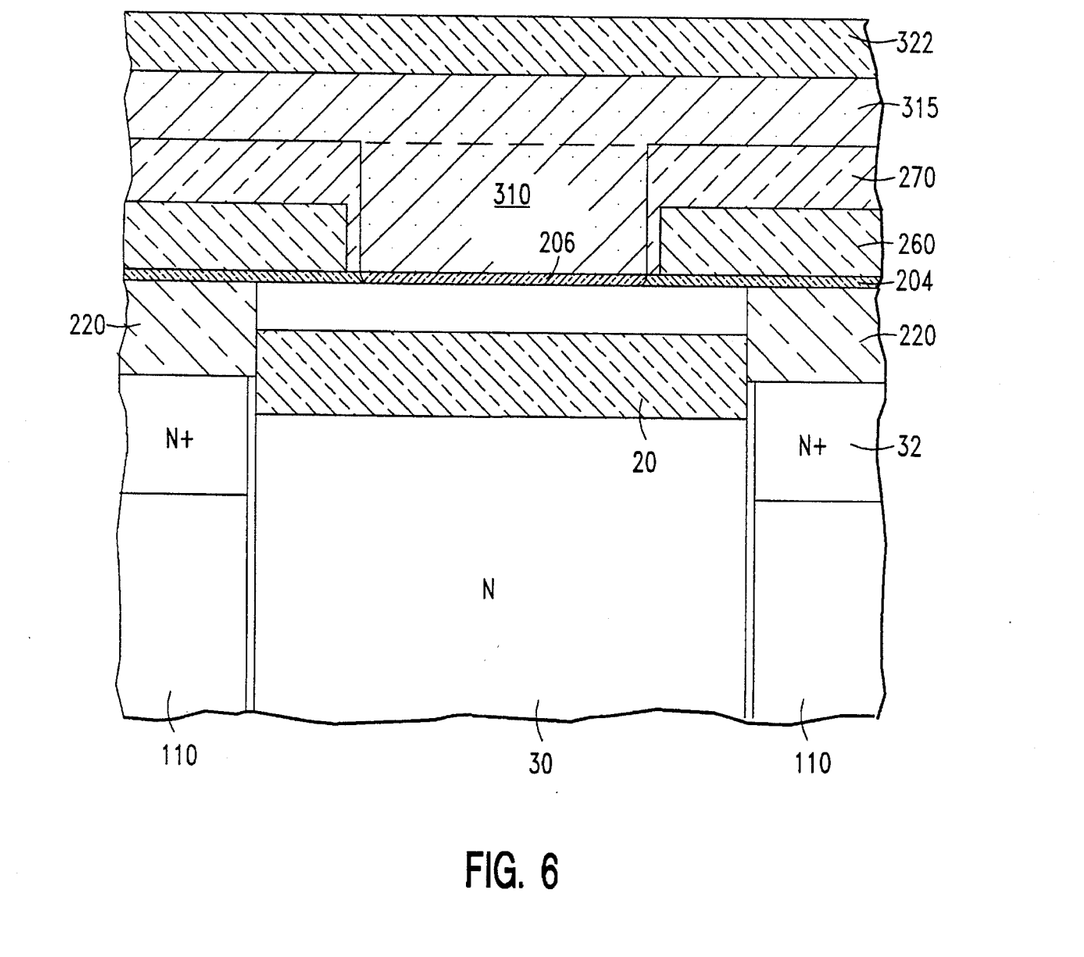
FIG. 6 shows an orthogonal cross section to that of FIGS. 1-4.

Referring now to FIG. 6, an orthogonal cross section along the line 6—6 in FIG. 5 is shown, illustrating the relation between the field shield 260, isolated by oxide 204, the damascene poly 310 and the wordline poly 315. TEOS 220 on the left and right of FIG. 6 are in the trench capacitors of the cells adjacent to the cell containing gate contact 310.

Contact from a power bus to the buried P$^+$ layer 32, through which body contacts are made, may be made every 512 wordlines or any other spacing that is suitable for the layer resistivity and other parameters of a particular circuit. Field-shield contacts are made outside the memory array.

Those skilled in the art will appreciate that body contact 35 could have been formed from an earlier layer such as 310 by forming an aperture for contact 35 before the deposition of layer 310 and then removing poly that might cause a short between contact 35 and gate contact 310 during the patterning of the gate stack. The extra steps required in the present method are justified by the improvement in density made possible with the invention.

Various materials, deposition methods and etchants are not critical and those skilled in the art will readily be able to modify the steps listed or to substitute equivalents. The thicknesses and dopants indicated are intended for an illustrative circuit in which the array supply voltage is 2 V, the field shield is biased at −1.5 V and buried layer 32 is biased at −1 V, while substrate 30 is at ground. The word line is boosted to 3.5 V and the bitline is operated at 2 V. Those skilled in the art will readily appreciate that different embodiments of the invention, such as different bias values, a P-FET array with either an n- or p- type layer 10 may be made in view of the enclosed teaching and the following claims are not meant to be limited to the embodiments disclosed.

We claim:

1. A method of forming an SOI DRAM having a memory array having transistor body contacts in the memory array comprising the steps of:

preparing an SOI wafer having a semiconducting substrate, a semiconductor device layer above said substrate and an insulating layer between said substrate and said device layer;

forming a buried conductive layer below and abutting said insulating layer;

forming a set of capacitors in contact with said semiconducting substrate in said memory array;

forming a field shield having a field shield top surface and isolated from said device layer over said set of capacitors in said memory array;

forming a set of parallel active area apertures, each having an active area axis, in said field shield;

forming a set of transistors, having transistor bodies, in said device layer and below said active area apertures;

forming a set of body contact apertures extending down through said device layer to said buried conductive layer in a body contact subset of said active area apertures; and forming a set of conductive members connecting said buried conductive layer and said device layer in said body contact subset, whereby conductive members in said set of conductive members form body contacts between said transistor bodies and said buried conductive layer.

2. A method of forming an SOI DRAM according to claim 1, in which:

said step of forming a set of capacitors in said memory array comprises a step of forming a set of deep trenches through said device layer and said insulating layer and extending into said substrate; and forming a set of capacitors in said set of deep trenches.

3. A method of forming an SOI DRAM according to claim 2, in which:

said step of forming a set of transistors includes a step of forming a set of conductive gate contacts within said set of active area apertures and having a gate contact top surface coplanar with said field shield top surface.

4. A method of forming an SOI DRAM according to claim 3, further including a step of forming word lines connecting a plurality of said gate contacts along an axis perpendicular to said active area axes, said word lines being deposited on said gate contact top surface and said field shield top surface.

5. A method of forming an SOI DRAM according to claim 1, in which said steps of forming capacitors and transistors include forming within said active area apertures at least two DRAM cells along said active area axis, each cell containing a capacitor and a transistor connected to said capacitor, said capacitors being separated along said active area axis by a body contact area in said device layer.

6. A method of forming an SOI DRAM according to claim 5, in which said step of forming a set of body contact apertures in said body contact subset includes a step of forming a self-aligned body contact aperture through said body contact area in said device layer.

7. A method of forming an SOI DRAM according to claim 2, in which said steps of forming capacitors and transistors include forming within said active area apertures at least two DRAM cells along said active area axis, each cell containing a capacitor and a transistor connected to said capacitor, said capacitors being separated along said active area axis by a body contact area in said device layer.

8. A method of forming an SOI DRAM according to claim 7, in which said step of forming a set of body contact apertures in said body contact subset includes a step of forming a self-aligned body contact aperture through said body contact area in said device layer.

9. A method of forming an SOI DRAM having a memory array containing a first polarity of transistors and CMOS support circuitry containing said first polarity of transistors and a second polarity of transistors opposite said first polarity, those of said first polarity of transistors within said array having body contacts, comprising the steps of:

preparing an SOI wafer having a semiconducting substrate, a semiconductor device layer above said substrate and an insulating layer between said substrate and said device layer;

forming a buried conductive layer below and abutting said insulating layer;

forming a set of capacitors in contact with said semiconducting substrate in said memory array;

simultaneously forming a first gate poly layer outside said array and a field shield having a field shield top surface and isolated from said device layer over said set of capacitors in said memory array;

forming a set of parallel active area apertures, each having an active area axis, in said field shield;

simultaneously forming a first set of transistors of said first polarity in said device layer and below said active area apertures and a second set of transistors of said first polarity in said device layer in said support circuitry;

forming a set of body contact apertures extending down through said device layer to said buried conductive layer in a body contact subset of said active area apertures; and forming an array set of conductive members connecting said buried conductive layer and said device layer in said body contact subset, whereby conductive members in said set of conductive members form body contacts between a set of transistor bodies in said transistors of first polarity and said buried conductive layer.

10. A method of forming an SOI DRAM according to claim 9, in which:

said step of forming a set of capacitors in said memory array comprises a step of forming a set of deep trenches through said device layer and said insulating layer and extending into said substrate; and forming a set of capacitors in said set of deep trenches.

11. A method of forming an SOI DRAM according to claim 10, in which:

said step of forming a set of transistors includes a step of depositing a first gate conductive layer inside and outside said array, forming a set of conductive gate contacts from said first gate conductive layer within said set of active area apertures and having a gate contact top surface coplanar with said field shield top surface and with a first gate contact conductive layer top surface outside said array.

12. A method of forming an SOI DRAM according to claim 11, further including steps of depositing a second gate conductive layer in and outside said array, thereby forming a composite gate conductive layer outside said array;

patterning said second gate conductive layer to form word lines connecting a plurality of said gate contacts along an axis perpendicular to said active area axes in said array, said word lines being deposited on said gate contact top surface and said field shield top surface in said array, and patterning composite gate conductive layer to form transistor gates outside said array.

13. A method of forming an SOI DRAM according to claim 9, in which said steps of forming capacitors and transistors include forming within said active area apertures at least two DRAM cells along said active area axis, each cell containing a capacitor and a transistor connected to said capacitor, said capacitors being separated along said active area axis by a body contact area in said device layer.

14. A method of forming an SOI DRAM according to claim 13, in which said step of forming a set of body contact apertures in said body contact subset includes a step of forming a self-aligned body contact aperture through said body contact area in said device layer.

15. A method of forming an SOI DRAM according to claim 10, in which said steps of forming capacitors and transistors include forming within said active area apertures at least two DRAM cells along said active area axis, each cell containing a capacitor and a transistor connected to said capacitor, said capacitors being separated along said active area axis by a body contact area in said device layer.

16. A method of forming an SOI DRAM according to claim 15, in which said step of forming a set of body contact apertures in said body contact subset includes a step of forming a self-aligned body contact aperture through said body contact area in said device layer.

* * * * *